United States Patent [19]

Ross

[11] Patent Number: 5,058,742

[45] Date of Patent: Oct. 22, 1991

[54] ELECTRONIC CIRCUIT CARRIER

[76] Inventor: Milton I. Ross, 400 College Ave., Haverford, Pa. 19041

[21] Appl. No.: 185,988

[22] Filed: Apr. 25, 1988

[51] Int. Cl.⁵ .............................................. B65D 85/30
[52] U.S. Cl. ..................................... 206/331; 206/328
[58] Field of Search ................................ 206/328-334

[56] References Cited

U.S. PATENT DOCUMENTS

| | | | |
|---|---|---|---|
| 2,861,250 | 11/1958 | Elwell | 206/331 |
| 3,184,532 | 5/1965 | Spera | 206/331 |
| 3,427,550 | 2/1969 | Helda et al. | 206/331 |
| 3,441,853 | 4/1969 | Bodine | 206/331 |
| 3,653,498 | 4/1972 | Kisor | 206/329 |
| 3,673,543 | 6/1972 | Garner | 206/328 |
| 3,700,100 | 10/1972 | Bohannon, Jr. | 206/332 |
| 3,846,740 | 11/1974 | Damon | 206/328 |

Primary Examiner—Jimmy G. Foster
Attorney, Agent, or Firm—Walter B. Udell

[57] ABSTRACT

An electronic circuit package carrier which imposes no mechanical stresses upon the leads of the circuit package carried, the carrier being provided with enlarged clear holes through which the circuit package leads are freely passable, a plurality of resilient fingers which press the leds against the root of V-shaped channels into desired positions for shipping, testing and subsequent removal of the package from the carrier, and an aperture through which a push rod is projectable to eject the circuit package from the carrier.

7 Claims, 2 Drawing Sheets

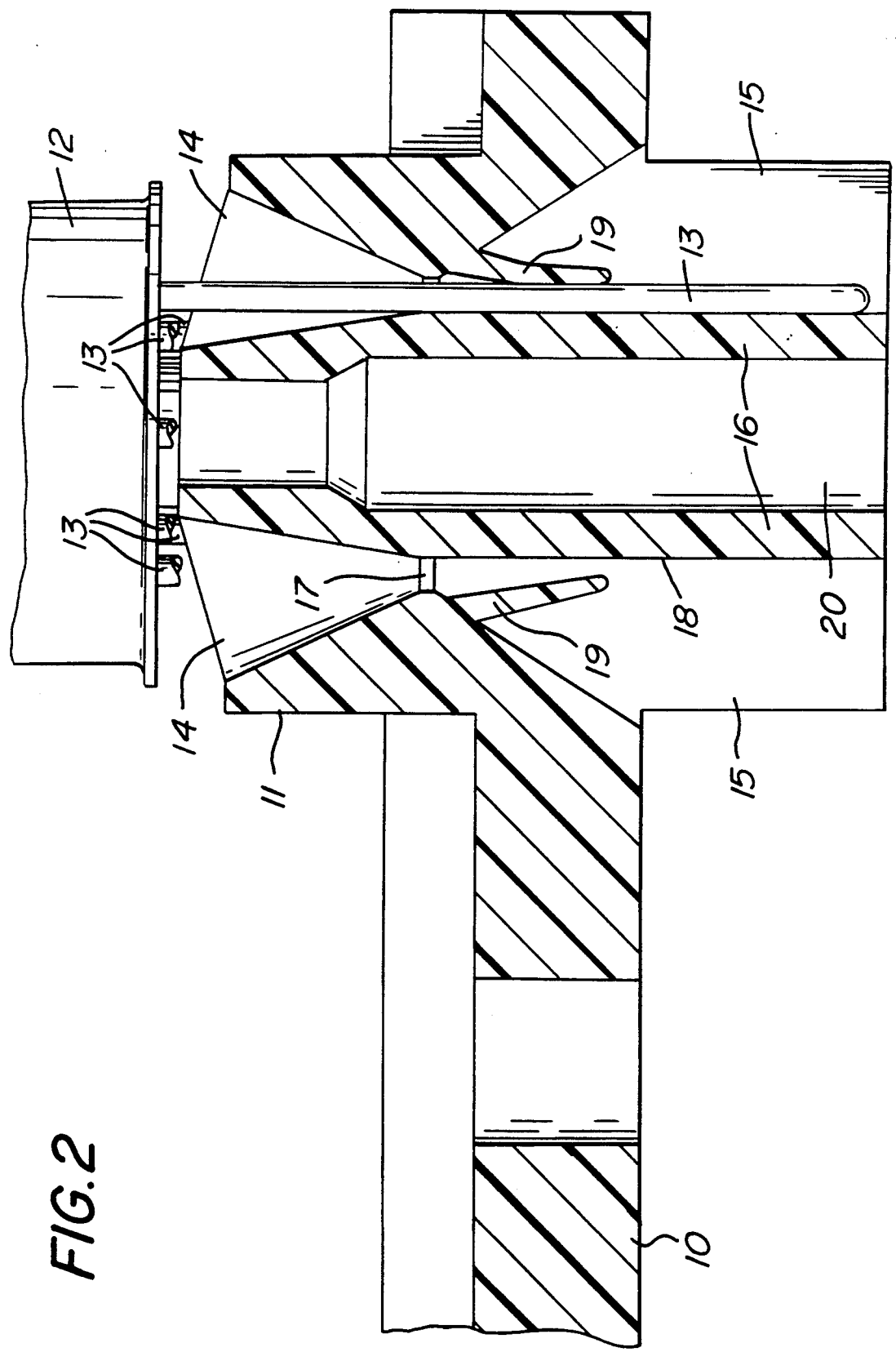

ELECTRONIC CIRCUIT CARRIER

This invention relates generally to electronic circuit package carriers, and more particularly relates to such carriers of the TO package design having an array of parallel leads arranged in circular form configuration. Such circuit packages are made with various numbers of leads, as for example the eight lead TO-5 package, and other packages having 10 leads, and so forth.

The carriers for these devices are utilized by the electronic circuit package manufactures for automatic loading and unloading of the circuit packages to the carriers, to mechanically hold the circuit packages for shipment to protect the leads, and also to hold the packages for automatic circuit testing by automated equipment. One particular problem has always been the mechanical retention of the circuit package in the carrier. In the past, various configurations have been worked out for such purpose.

In one form, a retractable arm has been employed to overhang the top of the circuit package and prevent it from being dislodged out of the carrier. This type of device has the drawback that it cannnot be used with some kinds of automated equipment for inserting the electronic circuit package into the carrier. In another form, the carrier is made with hole positions through which the leads of the circuit package are projectable, the hole positions being closed by a layer of molded plastic called flashing. The purpose of having the flashing cover the holes is so that the leads may be projected piercingly through the flashing and thereafter be gripped by the edges of the pierced flashing as a retention mechanism. This type of device also suffers from a serious drawback in that it is difficult to control the thickness of flashing so that on many occassions the flashing does not give way and the leads do not pierce some or all of the flashing points and are instead bent up, rendering the circuit package in need of lead straightening, or useless because of hermetic seal breakage.

The carrier according to the invention suffers from none of these drawbacks, but instead utilizes a configuration which guides the electronic circuit package leads gently through over-sized clear holes in the carrier, which avoids bending or otherwise disorting the leads, and also does not put undue mechanical stresses upon them. After the leads pass through the clear holes in the carrier they each pass alongside of and deflect a resilient finger molded integrally with the carrier. The finger geometry is so designed and that the fingers deflect easily when engaged by the electronic circuit package leads, and thereafter resiliently press the leads into a formed channel which maintains them in their desired straight alignment positions in the base of a V-slot where they are easily accessible for engagement by the test leads of automatic testing equipment. As will be seen, the leads are also in an exactly known position. Finally the carrier is formed with a central ejection hole for automatically removing the circuit package without having to grasp the package case.

Accordingly, it is a primary object of the invention to provide a novel electronic circuit package carrier which imposes no mechanical stresses upon the leads of the circuit package.

Another object of the invention is to provide a novel electronic circuit package carrier as aforesaid of the TO style package wich is provided with enlarged clear holes through which the circuit package leads are easily passed, and a plurality of resilient fingers which press the leads into desired positions for testing and subsequent removal of the package from the carrier.

The foregoing and other objects of the invention will become clear from a reading of the following specification in conjunction with an examination of the drawings, wherein:

FIG. 2 is an enlarged fragmentary vertical cross-sectional view through the carrier of FIG. 1 as would be seen when viewed along the line 2—2 on FIG. 1;

In the several figures, like elements are denoted by like reference characters.

Figure 1:
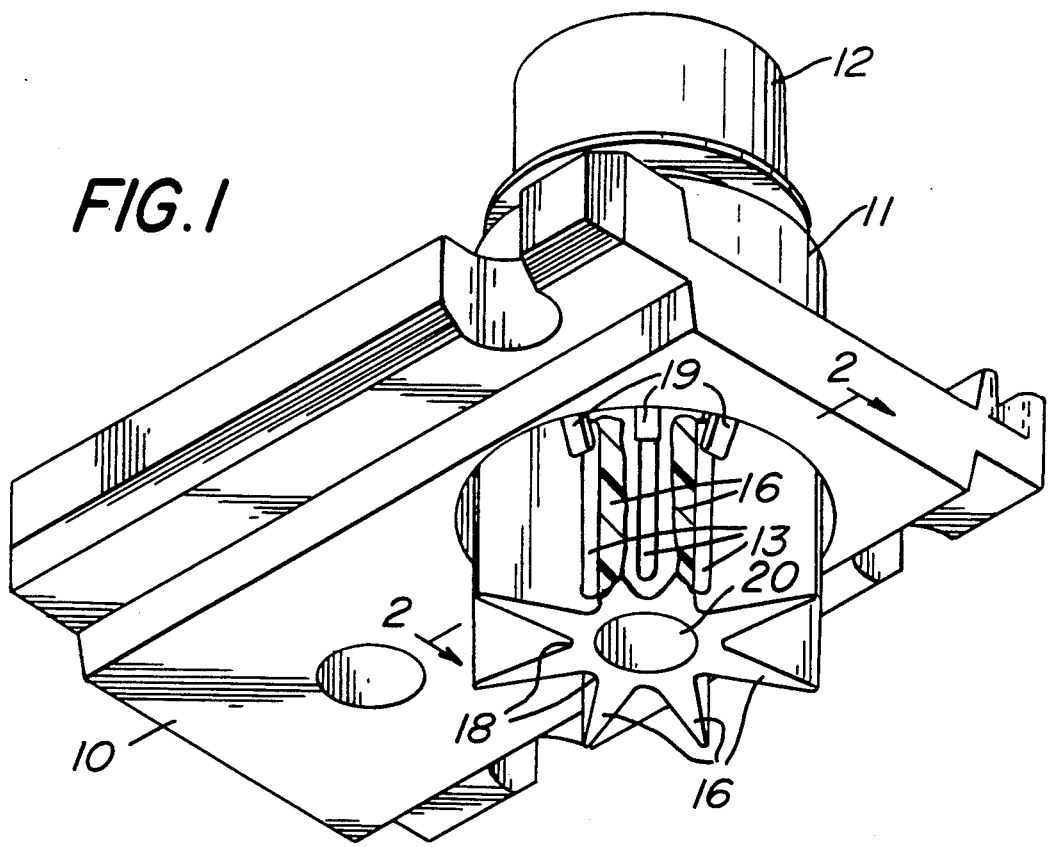
FIG. 1 is an isometric view from below of a typical TO type package carrier with some parts of the carrier shown sectioned away for clarity of view.

Turning now to the drawings there is seen a main carrier body, designated generally as 10, of generally flat rectangular form, having formed proximate to one end thereof and extending transversely to the plane of the main body a cylindrical tower structure 11 which extends both above and below the plane of the main carrier body. Seated on the top pedestal of the tower 11 is the body of an electronic circuits package of the TO-5 type, designated generally as 12. Extending downwardly from the bottom of the circuit package 12 are a plurality of leads 13. The cylindrical tower 11 is of a generally known configuration with two specific differences, including eight triangular pyramidal openings 14 spaced equiangularly about the axis of the cylindrical tower and positioned around the outer perimeter thereof, and eight correspondingly underlying V-shaped lead channels 15 within which the leads 13 of the circuit package 12 are designed to lie, the lead channels 15 being formed by the wedge shaped ribs 16. Two of the ribs 16 have been partly sectioned away in the showing of FIG. 1 in order to disclose the positions of the leads 13 in the channels 15, and similarly in the enlarged vertical cross section showing of FIG. 2.

At the junction of the triangular pyramidal openings 14 and the V-shaped lead channels 15, approximately at the plane of the main carrier body, are circular openings 17 of sufficiently larger diameter than that of the circuit package leads 13 so that the leads 13 may freely and easily pass through the lead openings 17. Molded integrally with the cylindrical tower portion of the carrier and extending downward within the lead channels 15 from a point slightly below the lead openings 17, and angled radially inward toward the root 18 of each lead channel 15, is a resilient finger 19.

Figure 3:
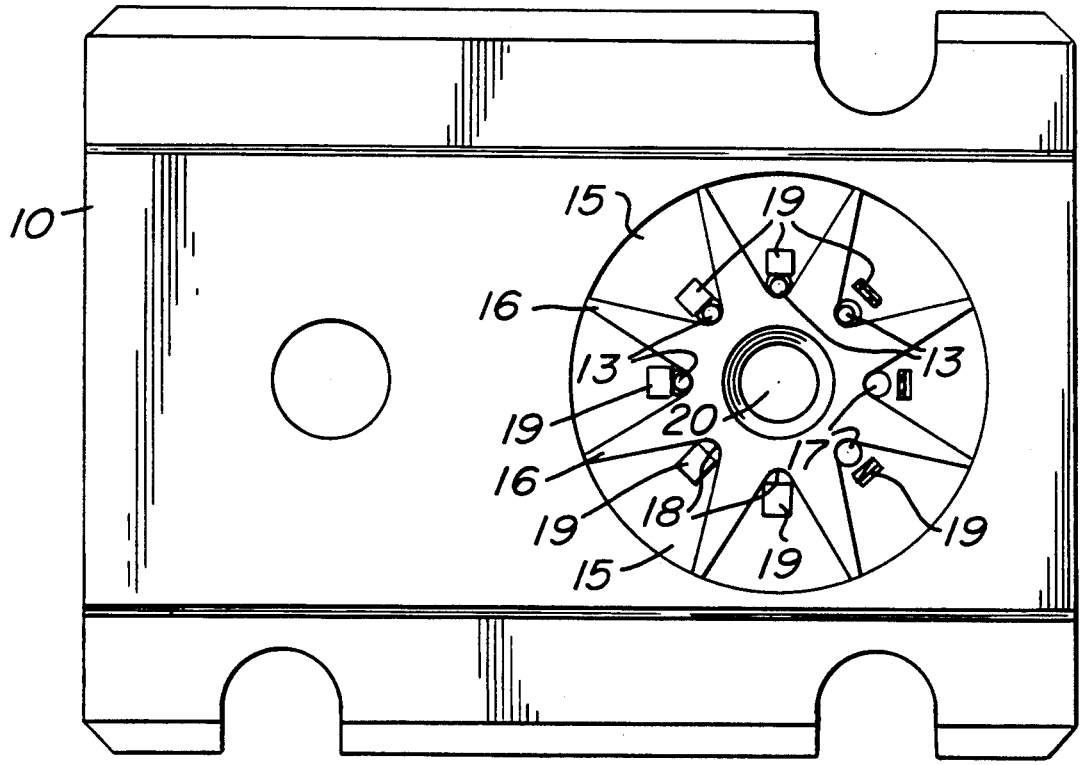
FIG. 3 is a bottom plan view of the carrier shown in FIG. 1 with some of the resilient fingers shown broken away, and with some of the circuit package leads removed, all for purposes of clarity in illustrating the invention.

As best seen in FIGS. 2 and 3, where it is observed that some of the leads 13 have been removed for clarity in the drawings, it is observed that when no lead 13 has been inserted through a lead opening 17 and into the lead channel 15, that the resilient fingers 19 extend radially inward from the fixed end to the free tip so that the fingers effectively overlie approximately half of the lead opening 17. When the leads of the circuit package have been passed through the lead openings 17 and downward past the fingers 19, the leads 13 are pressed upon by the fingers 19 which latter are resiliently deflected radially outwardly to allow the leads to pass. The slide surface of the resilient fingers against the side surface of the leads 13 gently presses these leads into the root 18 of the lead channels 15. The frictional engagement of the fingers against the leads holds the leads firmly between the fingers and the lead channel root and thereby retains the circuit package in the carrier even when in a test equipment vibratory orientation bowl. A push rod may be projected upward through passage 20 extending centrally through the tower 11 to eject the circuit package 12.

Since the leads do not have to pierce and penetrate any flashings over the lead openings 17, the leads are never bent or otherwise damaged and may be easily projected into the carrier and withdrawn therefrom. The fingers 19 also maintain the leads in a fixed known position in the root 18 of the lead channels 15, so that electrodes from automatic testing equipment may be moved accurately into contact with the leads for effecting circuit testing. As will also be apparent, the fingers 19 in no way interfere with insertion or removal of the circuit package when being done by automatic equipment. Typically, the carrier could be molded of glass-filled polysulfone, polyester or ESD plastics, so that the fingers 19 have sufficient holding strength. Moreover, if even greater finger strength is desired the thickness of the finger and/or its length can be increased. While the invention has been illustrated in connection with the TO-5 package the concept is extendable to other types of carriers.

Having now described the invention in connection with a particularly illustrated embodiment thereof, modifications and variations of the invention may now naturally occur from time to time to those persons normally skilled in the art without departing from the essential scope and spirit of the invention, and accordingly it is intended to claim the same broadly as well as specifically as indicated by the appended claims.

What is claimed is:

1. An electronic circuit package carrier for carrying a circuit package of the type having circuit leads extending therefrom in a substantially parallel array, comprising in combination,
    a) a carrier body having a plurality of apertures therethrough through which the leads of a circuit package to be carried are freely projectable, the number of said apertures being at least equal to the number of circuit package leads to be projected therethrough, and each such aperture being located in the carrier body so that it is positioned to receive a circuit package lead without deflecting the lead from its intended position, said carrier body comprising a cylindrical formation in which said plurality of apertures therethrough are angularly spaced at distances radially outward from the cylindrical axis in a projection on a plane orthogonal to the cylindrical axis,
    b) said carrier body further including a circuit package leads backing formation against which at least one lead is positionable in its intended undeflected position, said leads backing formation being located radially inward of said apertures,
    c) at least one deflectable finger carried by said carrier body and so positioned that when the leads of a circuit package are projected through said apertures at least one lead is engageable by said deflectabe finger to press the said lead against the said leads backing formation, said at least one deflectable finger being a cantilever formation having a fixed end and a free end, said fixed end being located radially outwardly on said carrier body with respect to said leads backing formation, and said finger projecting radially inward toward said leads backing formation so that the space between the free end of said finger and said leads backing formation is less than the cross section of the circuit package lead which is intended to pass therethrough,
    whereby said finger is deflectable by passage of a circuit package lead so that the lead is pressed between said finger and said leads backing formation and the circuit package is removably retainable to said carrier.

2. An electronic circuit package carrier as set forth in claim 1, wherein the said apertures through the carrier body for having circuit package leads projected therethrough are larger in cross section than the cross sections of the leads to be projected therethrough.

3. An electronics circuit package carrier as set forth in claim 1 wherein said deflectable finger is resiliently deflectable and is formed as an intergral part of said carrier.

4. An electronics circuit package carrier as set forth in claim 1 wherein said at least one deflectable finger is resiliently deflectable, and wherein said deflectable finger and said leads backing formation are both formed as an integral part of said carrier.

5. An electronics circuit package carrier as set forth in claim 1 further including an aperture extending axially completely through said cylindrical formation in alignment with a portion of a circuit package when carried by the carrier, whereby the circuit package is ejectable from the carrier by a push rod projected through said aperture.

6. An electronics circuit package carrier for carrying a circuit package of the TO type having circuit leads extending therefrom in a substantially cylindrical parallel array, comprising in combination,
    a) a generally rectangular main body and a cylindrical tower formation extending orthogonally above and below the plane of the main body, said cylindrical tower formation having a plurality of apertures therethrough each of such size that the leads of a circuit package to be carried are freely projectable therethrough, said apertures being equiangularly spaced about the cylindrical axis at the same radius and the number of said apertures being at least equal to the number of circuit package leads to be projected therethrough, said apertures being located in the cylindrical tower so that they are positioned to receive circuit package leads without deflecting the leads from their intended positions,
    b) said cylindrical tower further including a circuit package leads backing formation disposed radially inward of and adjacent to each of said apertures and against which the circuit package leads are positionable in their intended undeflected positions, and
    c) a plurality of resiliently deflectable fingers formed integrally with said cylindrical formation and so positioned relative to said apertures that when the leads of a circuit package are projected through said apertures each lead is engageable by a separate one of said plurality of fingers which press the said lead against the said leads backing formation,
    whereby the circuit package is removably retainable to said carrier.

7. An electronics circuit package carrier as set forth in claim 6 further including an aperture extending axially completely through said cylindrical formation in alignment with a portion of a circuit package when carried by the carrier, whereby the circuit package is ejectable from the carrier by a push rod projected through said aperture.

* * * * *